(12) United States Patent
Toshiyoshi et al.

(10) Patent No.: US 11,716,033 B2
(45) Date of Patent: Aug. 1, 2023

(54) VIBRATION-DRIVEN ENERGY HARVESTING ELEMENT AND VIBRATION-DRIVEN ENERGY HARVESTING DEVICE

(71) Applicants: The University of Tokyo, Tokyo (JP); SAGINOMIYA SEISAKUSHO, INC., Tokyo (JP)

(72) Inventors: Hiroshi Toshiyoshi, Tokyo (JP); Hisayuki Ashizawa, Sayama (JP); Masahiro Morita, Sayama (JP)

(73) Assignees: The University of Tokyo, Tokyo (JP); Saginomiya Seisakusho, Inc., Tokyo (JP)

( * ) Notice: Subject to any disclaimer, the term of this patent is extended or adjusted under 35 U.S.C. 154(b) by 399 days.

(21) Appl. No.: 17/053,598

(22) PCT Filed: Apr. 19, 2019

(86) PCT No.: PCT/JP2019/016865
§ 371 (c)(1),
(2) Date: Nov. 6, 2020

(87) PCT Pub. No.: WO2019/216165
PCT Pub. Date: Nov. 14, 2019

(65) Prior Publication Data
US 2021/0234478 A1    Jul. 29, 2021

(30) Foreign Application Priority Data

May 8, 2018  (JP) .................................. 2018-090196

(51) Int. Cl.
*H02N 1/08* (2006.01)
*B81B 3/00* (2006.01)

(52) U.S. Cl.
CPC .............. *H02N 1/08* (2013.01); *B81B 3/0086* (2013.01); *B81B 2203/0163* (2013.01)

(58) Field of Classification Search
CPC ............ H02N 1/00; H02N 1/002; H02N 1/06; H02N 1/08; B81B 3/0021; B81B 3/0086
See application file for complete search history.

(56) References Cited

U.S. PATENT DOCUMENTS 6,833,687 B2 * 12/2004 Landolt .................... H02N 1/00
320/166
2011/0175367 A1    7/2011 Matsumoto
(Continued)

FOREIGN PATENT DOCUMENTS

JP    2009-95181 A    4/2009
JP    2011-151944 A   8/2011
(Continued)

OTHER PUBLICATIONS

Liu et al., Sandwich Structured Electrostatic/Electrets Parallel-Plate Power Generator for Low Acceleration and Low Frequency Vibration Energy Harvesting, 2012 IEEE 25th International Conference on Micro Electro Mechanical Systems (MEMS), Paris, France, 2012, pp. 1277-1280 (Year: 2012).*
(Continued)

*Primary Examiner* — Eric Johnson
(74) *Attorney, Agent, or Firm* — Crowell & Moring LLP

(57) ABSTRACT

A vibration-driven energy harvesting element that outputs an alternating current power from an output line, due to vibration from outside includes: an intermediate electrode that is not connected to the output line; a plurality of electret electrodes, each electret electrode being arranged to face the intermediate electrode and having an electret on at least a part of a surface of the electret electrode on a side facing the intermediate electrode; a holding unit that holds the intermediate electrode and the plurality of electret electrodes (Continued)

such that the intermediate electrode and the plurality of electret electrodes can vibrate with respect to each other; and a charge injector that injects a charge having characteristics opposite to a charge of the electrets formed in the surfaces of the plurality of electret electrodes, to the intermediate electrode.

10 Claims, 9 Drawing Sheets

(56) References Cited

U.S. PATENT DOCUMENTS

| | | |
|---|---|---|
| 2012/0043851 A1 | 2/2012 | Sano |
| 2013/0076202 A1* | 3/2013 | Naito .................. H02N 1/002 310/300 |
| 2014/0015374 A1 | 1/2014 | Sano |
| 2014/0065751 A1 | 3/2014 | Suzuki et al. |
| 2015/0280616 A1 | 10/2015 | Naito et al. |
| 2021/0234478 A1 | 7/2021 | Toshiyoshi et al. |

FOREIGN PATENT DOCUMENTS

| | | |
|---|---|---|
| JP | 2012-44823 A | 3/2012 |
| JP | 2014-49557 A | 3/2014 |
| JP | 2014-228283 A | 12/2014 |
| JP | 5990352 B1 | 9/2016 |
| JP | 6927527 B2 | 9/2021 |

OTHER PUBLICATIONS

International Search Report (PCT/ISA/210) issued in PCT Application No. PCT/JP2019/016865 dated Jul. 16, 2019 with English translation (two (2) pages).

Japanese-language Written Opinion (PCT/ISA/237) issued in PCT Application No. PCT/JP2019/016865 dated Jul. 16, 2019 (four (4) pages).

Japanese-language Office Action issued in Japanese Application No. 2021-015902 dated May 17, 2022 with English translation (three (3) pages).

* cited by examiner (a)

(b)

(c)

(a)

(b)

(c)

(a)

(b)

US 11,716,033 B2

VIBRATION-DRIVEN ENERGY HARVESTING ELEMENT AND VIBRATION-DRIVEN ENERGY HARVESTING DEVICE

TECHNICAL FIELD

The present invention relates to a vibration-driven energy harvesting element and a vibration-driven energy harvesting device.

BACKGROUND ART

As one of energy harvesting technologies for harvesting energy from environmental vibration, an approach of generating electric power from environmental vibration using a vibration-driven energy harvesting element, which is a MEMS (Micro Electro Mechanical Systems) vibration element, is known. The vibration-driven energy harvesting element itself includes a piezoelectric element or a capacitance-type element. When the element is vibrated at a frequency of environmental vibration, the element generates an alternating current power having the same frequency. The electrostatic induction-type vibration-driven energy harvesting element generates an electric power, using induced charges generated by a plurality of electrodes vibrating with respect to each other (for example, see PTL1).

CITATION LIST

Patent Literature

PTL1: Japanese Laid-Open Patent Publication No. 2014-228283

SUMMARY OF INVENTION

Technical Problem

Since vibration energy of environmental vibration is weak, a vibration-driven energy harvesting element that converts environmental vibration into electric energy with a high efficiency is required.

Solution to Problem

A vibration-driven energy harvesting element that outputs an alternating current power from an output line, due to vibration from outside according to the 1st aspect comprises: an intermediate electrode that is not connected to the output line; a plurality of electret electrodes, each electret electrode being arranged to face the intermediate electrode and having an electret on at least a part of a surface of the electret electrode on a side facing the intermediate electrode; a holding unit that holds the intermediate electrode and the plurality of electret electrodes such that the intermediate electrode and the plurality of electret electrodes can vibrate with respect to each other; and a charge injector that injects a charge having characteristics opposite to a charge of the electrets formed in the surfaces of the plurality of electret electrodes, to the intermediate electrode.

The vibration-driven energy harvesting element according to the 2nd aspect is in the vibration-driven energy harvesting element according to the 1st aspect, wherein: a direction of the relative vibration is parallel to the surfaces of the plurality of electret electrodes facing the intermediate electrode.

The vibration-driven energy harvesting element according to the 3rd aspect is in the vibration-driven energy harvesting element according to the 2nd aspect, wherein: when the intermediate electrode moves in a first direction with respect to the plurality of electret electrodes due to the relative vibration, an area of a facing portion between one of the plurality of electret electrodes and the intermediate electrode increases and an area of a facing portion between another of the plurality of electret electrodes and the intermediate electrode decreases; and when the intermediate electrode moves in a second direction different from the first direction, the areas of the facing portions increase and decrease in a manner opposite to the case of the movement in the first direction.

The vibration-driven energy harvesting element according to the 4th aspect is in the vibration-driven energy harvesting element according to any one of the 1st through 3rd aspect, wherein: the charge injector connects a part of a circuit powered from the vibration-driven energy harvesting element, to the intermediate electrode.

The vibration-driven energy harvesting element according to the 5th aspect is in the vibration-driven energy harvesting element according to any one of the 1st through 3rd aspect, wherein: the charge injector includes a resistance element, and one end of the charge injector is connected to the intermediate electrode and another end of the charge injector is connected to at least one of the plurality of electret electrodes.

The vibration-driven energy harvesting element according to the 6th aspect is in the vibration-driven energy harvesting element according to the 4th or the 5th aspect, and further comprises: a control member that controls injection of a charge into the intermediate electrode by the charge injector.

A vibration-driven energy harvesting device according to the 7th aspect comprises: a vibration-driven energy harvesting element according to any one of the 1st through 6th aspect; and a power supply device.

Advantageous Effects of Invention

According to the present invention, energy of environmental vibration can be converted into electric energy with a high efficiency.

BRIEF DESCRIPTION OF DRAWINGS

FIGS. 2(a) to 2(c) are views showing charges induced in the electret electrodes 11 and the intermediate electrode 12 in each relative position of the intermediate electrode 12 with respect to the electret electrodes 11.

FIGS. 3(a) to 3(c) are views showing charges induced in the electret electrodes 11 and the intermediate electrode 12 in each relative position of the intermediate electrode 12 with respect to the electret electrodes 11.

FIG. 5(a) is a top view of the vibration-driven energy harvesting element 10c, and FIG. 5(b) is a cross-sectional view along line B-B in FIG. 5(a) as viewed from –Y direction.

DESCRIPTION OF EMBODIMENTS

Embodiment

Figure 1:
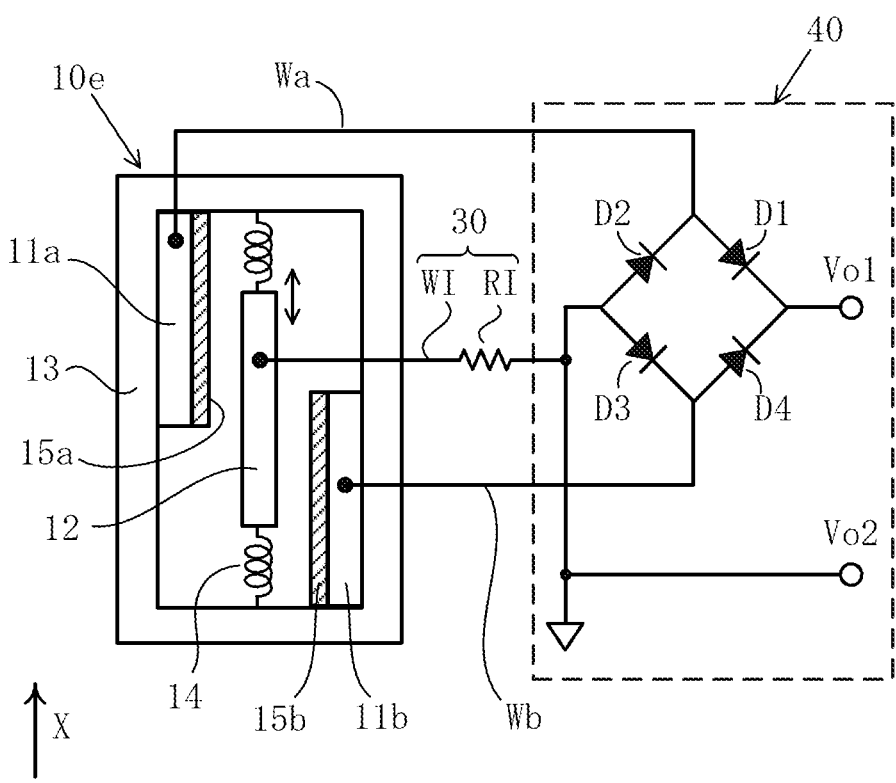
FIG. 1 is a view showing a configuration of a vibration-driven energy harvesting element 10 of an embodiment according to the present invention and a vibration-driven energy harvesting device 100 including the vibration-driven energy harvesting element 10.

Now, an embodiment of the present invention will be described with reference to the drawings. FIG. 1 is a view showing a vibration-driven energy harvesting device 100 including a vibration-driven energy harvesting element 10 of the embodiment according to the present invention. The vibration-driven energy harvesting device 100 includes the vibration-driven energy harvesting element 10 and a power supply device 40. The vibration-driven energy harvesting element 10, which is of capacitance-type, has a first electret electrode 11a, a second electret electrode 11b, and an intermediate electrode 12 arranged between both electret electrodes 11a, 11b.

The first electret electrode 11a is fixed to a support frame 13 and, as one example, a negatively charged electret 15a is formed in a surface of the first electret electrode 11a on a side facing the intermediate electrode 12.

The second electret electrode 11b is also fixed to a support frame 13 and, as an example, a negatively charged electret 15b is formed in a surface of the second electret electrode 11b on a side facing the intermediate electrode 12.

The electrets 15a, 15b are formed, for example, by being subjected to a known charging process described in Japanese Laid-Open Patent Publication No. 2014-049557.

The electret 15a and the electret 15b are also collectively referred to as an electret 15.

Further, an electrode on which the electret 15 is formed, such as the first electret electrode 11a and the second electret electrode 11b, is also collectively referred to as an electret electrode 11.

The intermediate electrode 12 is held by the support frame 13 via an elastically deformable holding unit 14 such as a spring. Therefore, when the vibration-driven energy harvesting element 10 including the support frame 13 vibrates in the X direction shown in FIG. 1 (in the vertical direction in FIG. 1), the intermediate electrode 12 vibrates in the X direction with respect to the first electret electrode 11a and the second electret electrode 11b due to an elastic deformation of the holding unit 14. Specifically, a relative vibration between the electrodes is generated with the vibration of the intermediate electrode 12 so that a capacitance between the intermediate electrode 12 and the first electret electrode 11a (an inter-electrode facing area) and a capacitance between the intermediate electrode 12 and the second electret electrode 11b (an inter-electrode facing area) increase and decrease in opposite phases. In this way, the capacitances between the intermediate electrode 12 and both electret electrodes 11 fluctuate in opposite phases, so that a vibration-driven energy harvesting efficiency is better than that of a capacitance-type vibration-driven energy harvesting element in which a fixed comb electrode and a movable comb electrode meshing with each other are moved with respect to each other.

Due to the relative vibration between the intermediate electrode 12 and the electret electrodes 11, positive or negative charges (positive charges in the first embodiment) are induced in the first electret electrode 11a and the second electret electrode 11b to generate an alternating current power. These charges are transmitted to the power supply device 40 provided outside the vibration-driven energy harvesting element 10 via a conductor wire Wa connected to the first electret electrode 11a and a conductor wire Wb connected to the second electret electrode 11b.

The power supply device 40 has a bridge-type full-wave rectification circuit including four diodes D1 to D4. The wire Wa is connected to an anode of the diode D1 and a cathode of the diode D2, and the wire Wb is connected to an anode of the diode D4 and a cathode of the diode D3.

The cathode of the diode D1 and the cathode of the diode D4 are connected to a first output terminal Vo1 of the power supply device 40, while the anode of the diode D2 and the anode of the diode D3 are connected to a second output terminal Vo2 of the power supply device 40 and remain at ground potential.

One end of a charge injection wire WI for injecting charges into the intermediate electrode 12 is connected to the intermediate electrode 12.

The other end of the charge injection wire WI is connected to one end of a resistance element RI. The other end of the resistance element RI is connected to the anode of the diode D2 and the anode of the diode D3 in the power supply device 40, that is, remains at ground potential.

The alternating current power generated by the vibration-driven energy harvesting element 10 converting vibration energy is output by the power supply device 40 as a power having a ground potential at the second output terminal Vo2 and a positive potential at the first output terminal Vo1.

Note that the power supply device 40 may include a capacitor or a voltage converter including a chopper-type DC-DC converter, for example.

Now, an operational principle of the vibration-driven energy harvesting device 100 using the vibration-driven energy harvesting element 10 of the embodiment will be described with reference to FIG. 2.

Each of FIGS. 2(a) to 2(c) represents a state of charges induced in the electrodes at each relative position, when the intermediate electrode 12 vibrates (moves) in the X direction with respect to the first electret electrode 11a and the second electret electrode 11b.

FIG. 2(a) shows a state of charges when the intermediate electrode 12 is located at an intermediate point of the vibration (hereinafter also referred to as a neutral point).

Since a +X side end of the intermediate electrode 12 faces negative charges 16a of the electret 15a formed in a surface of the first electret electrode 11a, positive charges 17a are induced in this portion.

Since a –X side end of the intermediate electrode 12 faces negative charges 16b of the electret 15b formed in a surface of the second electret electrode 11b, positive charges 17b are induced in this portion.

On the other hand, in a portion of the first electret electrode 11a that does not face the intermediate electrode 12, positive charges 18a are induced inside the first electret electrode 11a, caused by the negative charges 16a of the electret 15a.

In a portion of the second electret electrode 11b that does not face the intermediate electrode 12, positive charge 18b are induced inside the second electret electrode 11b, caused by the negative charges 16b of the electret 15b.

FIG. 2(a) described above shows that no electromotive force is generated between the first electret electrode 11a and the second electret electrode 11b and no movement of charges occurs. In this sense, the position of the intermediate electrode 12 in FIG. 2(a) is referred to as a neutral point, and the vibration-driven energy harvesting element 10 is said to be in a neutral state.

FIG. 2(b) shows a state in which the intermediate electrode 12 relatively moves to the +X side when compared with the state in FIG. 2(a).

In the state of FIG. 2(b), an area of those portion of the surface of the first electret electrode 11a that faces the intermediate electrode 12 is increased when compared with that in the state of FIG. 2(a). This leads to an increase of the positive charges 17a of the intermediate electrode 12 induced by the negative charges 16a of the electret 15a. As a result, a part of the positive charges 18a induced inside the first electret electrode 11a in the state of FIG. 2(a) becomes excess charges 19a.

On the other hand, in the state of FIG. 2(b), an area of those portion of the surface of the second electret electrode 11b that faces the intermediate electrode 12 is reduced when compared with that in the state of FIG. 2(a). This leads to a decrease of the positive charges 17b of the intermediate electrode 12 induced by the negative charges 16b of the electret 15b. As a result, within the second electret electrode 11b, charge deficient portions 20b are formed, in which positive charges to be induced are deficient with respect to the negative charges 16b of the electret 15b.

Therefore, in the state of FIG. 2(b), the first electret electrode 11a is positively charged and the second electret electrode 11b is negatively charged. With an electromotive force based on this charging, an electric power can be generated by allowing a current I1 to flow from the first electret electrode 11a to the second electret electrode 11b via an output circuit R. Here, a resistor R provided between the first electret electrode 11a and the second electret electrode 11b represents the power supply device 40 of FIG. 1.

On the other hand, FIG. 2(c) shows a state in which the intermediate electrode 12 relatively moves to the −X side when compared with the state in FIG. 2(a). In the state of FIG. 2(c), when compared with the state of FIG. 2(a), excess charges 19b are generated inside the second electret electrode 11b and charge deficient portions 20a, in which positive charges to be induced are deficient, are generated inside the first electret electrode 11a.

Therefore, in the state of FIG. 2(c), the first electret electrode 11a is negatively charged and the second electret electrode 11b is positively charged. With an electromotive force based on this charging, an electric power can be generated by allowing a current I2 to flow from the second electret electrode 11b to the first electret electrode 11a.

Note that the intermediate electrode 12 may be held by the holding unit 14 so as to be insulated from the first electret electrode 11a, the second electret electrode 11b, the support frame 13, and the like, or alternatively, the holding unit 14 itself may be formed of an insulating material.

By the way, if no charges are injected into the intermediate electrode 12 via the charge injection wire WI in a case where the vibration-driven energy harvesting element 10 is placed in an humid environment, for example, any charge to be held in the intermediate electrode 12 can be discharged via water vapor or ions in the atmosphere, or any charge that is otherwise to be induced in the intermediate electrode 12 may combine with ions in the gas. As a result, the intermediate electrode 12 becomes neutral. In this description, the discharge and neutralization of the intermediate electrode 12 as described above are collectively referred to as neutralization of the intermediate electrode 12.

Figure 2:
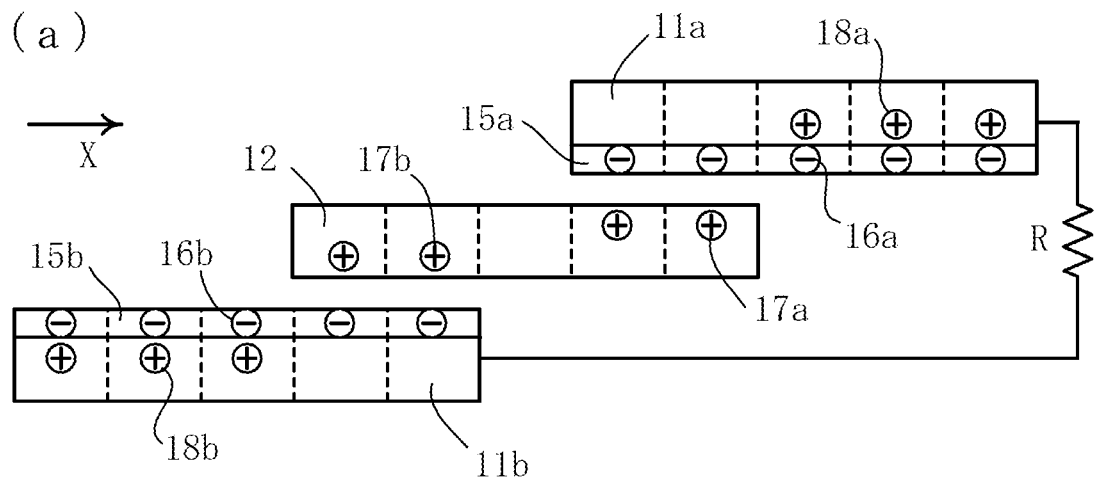
FIG. 2 is a view illustrating an operational principle of the vibration-driven energy harvesting element 10 of the embodiment.
Figure 2:
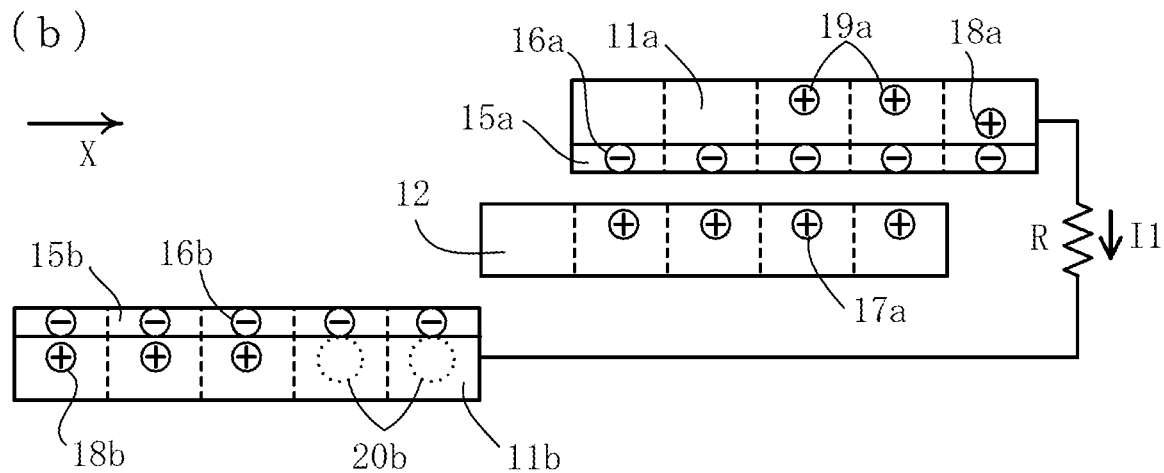
Figure 2:
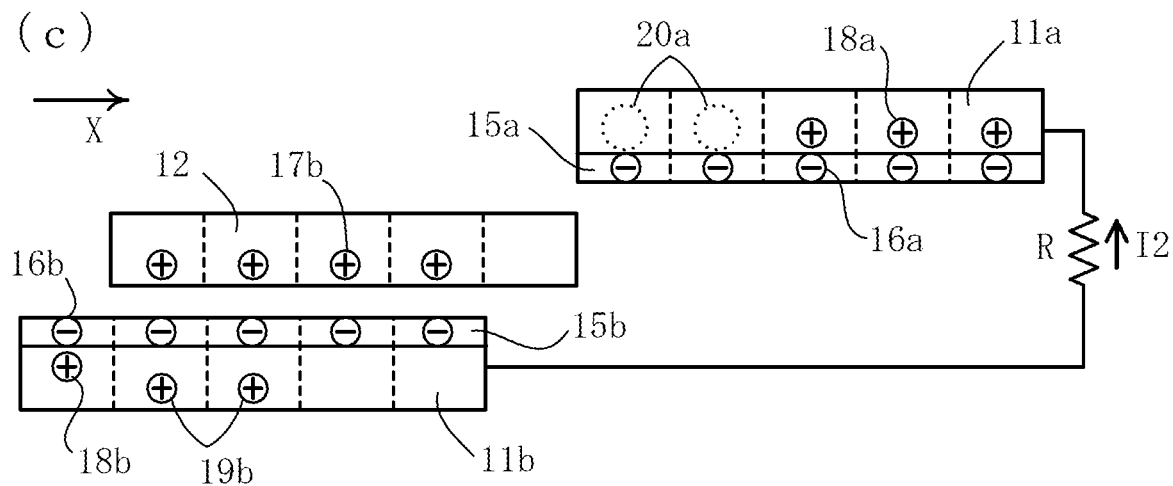
Figure 3:
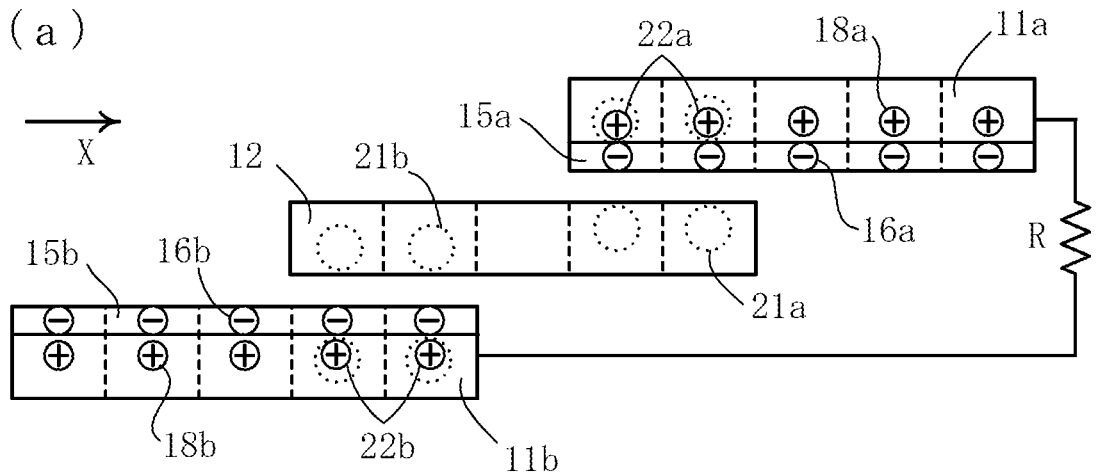
FIG. 3 is a view illustrating an aspect of an operation when the intermediate electrode 12 is neutralized.
Figure 3:
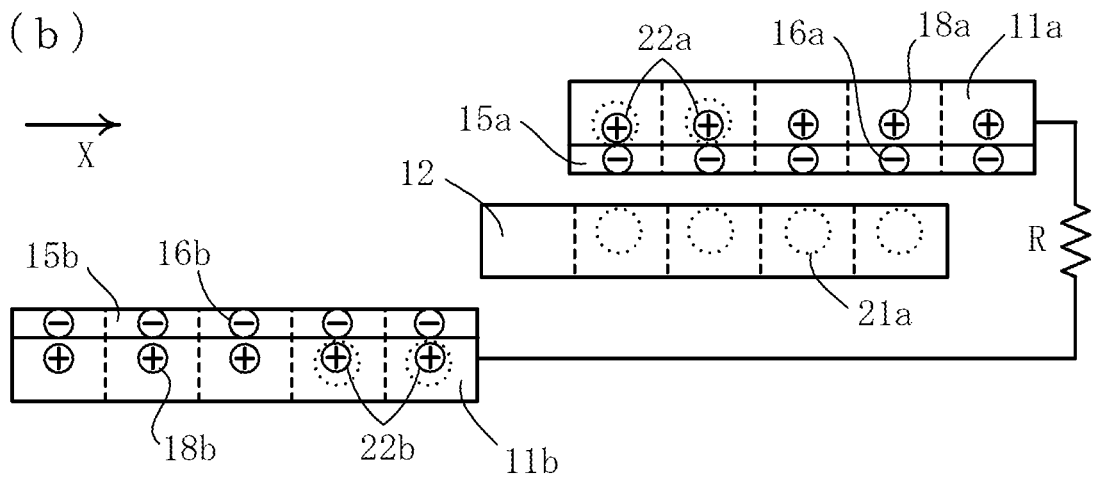
Figure 3:
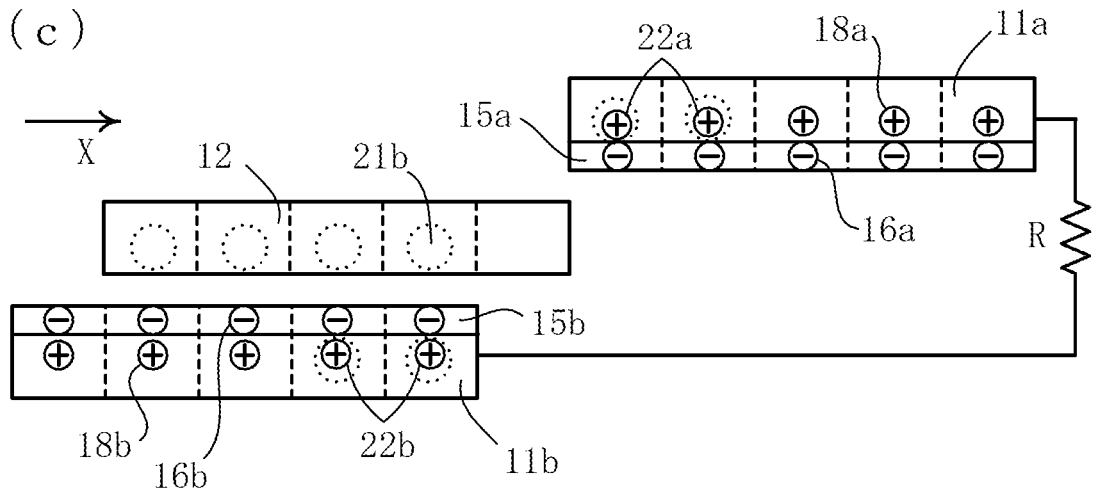

FIG. 3 is a view showing an operation of the vibration-driven energy harvesting element 10 when the intermediate electrode 12 is neutralized. Similarly to FIG. 2 described above, each of FIGS. 3(a) to (c) represents a state of charges induced in the electrodes at each relative position, when the intermediate electrode 12 vibrates (moves) in the X direction with respect to the first electret electrode 11a and the second electret electrode 11b.

Now, an operation of the vibration-driven energy harvesting element 10 in a case where any charge in the intermediate electrode 12 is discharged will be described based on differences between the state in FIG. 3 and the state shown in FIG. 2 described above.

FIG. 3(a) is a view corresponding to FIG. 2(a), showing a state of charges when the intermediate electrode 12 is located at a midpoint of the vibration. In a state where the intermediate electrode 12 is discharged, no positive charges are induced in those portions 21a of the intermediate electrode 12 that face the first electret electrode 11a and those portions 21b that face the second electret electrode 11b. Therefore, positive charges 22a induced by the negative charges 16a of the electret 15a are generated inside those portions of the first electret electrode 11a that face the intermediate electrode 12. Further, positive charges 22b induced by the negative charges 16a of the electret 15b are generated inside those portions of the second electret electrode 11b that face the intermediate electrode 12.

FIG. 3(b) is a view corresponding to FIG. 2(b), showing a state in which the intermediate electrode 12 relatively moves to the +X side from the position shown in FIG. 3(a).

FIG. 3(c) is a view corresponding to FIG. 2(c), showing a state in which the intermediate electrode 12 relatively moves to the −X side from the position shown in FIG. 3(a).

In the case of FIG. 3, unlike the case shown in FIG. 2, there is no charge in the intermediate electrode 12. Thus, states of the charges in the first electret electrode 11a, the second electret electrode 11b, and the intermediate electrode 12 do not change even if the state of the intermediate electrode 12 changes from the state of FIG. 3(a) to the state of FIG. 3(b) or FIG. 3(c).

That is, in the case where the intermediate electrode 12 is neutralized as shown in FIG. 3, no excess charge and charge deficiency occurs in any of the first electret electrode 11a and the second electret electrode 11b. Consequently, an electric power cannot be generated, even if the electret electrode 11 and the intermediate electrode 12 move (vibrate) with respect to each other.

Thus, in the vibration-driven energy harvesting element 10 of the embodiment, the charge injection wire WI and the resistance element RI are used to inject charges from the power supply device 40 to the intermediate electrode 12 in order to prevent the charge loss from the intermediate electrode 12. The charge injection wire WI and the resistance element RI can be interpreted as a charge injector 30.

In the vibration-driven energy harvesting element 10, charges having characteristics opposite to the charges of the electret 15 are injected into the intermediate electrode 12 from the power supply device 40 via the charge injector 30. This is caused by the charges of the electret 15 of the electret electrode 11 facing the intermediate electrode 12. When negative charge regions are provided in the surface of the electret electrode 11a, 11b, positive charges are injected into the intermediate electrode 12. By injecting the positive charges from the charge injector 30, the vibration-driven energy harvesting element 10 can maintain the charges in the intermediate electrode 12 for a long period of time, that is, a high power generation efficiency can be maintained for a long period of time. In a case of the positively charged electret electrode and the negatively charged intermediate electrode, negative charges are injected into the intermediate electrode.

Note that a location at which the charge injector 30 is connected is not limited to the anode of the diode D2 and the anode of the diode D3 in the power supply device 40 described above, but may be another location in the power supply device 40. However, in the power supply device 40, it is not preferable to connect the charge injector 30 to a portion connected to the wire Wa connected to the first electret electrode 11a or the wire Wb connected to the second electret electrode 11b, with a low electric resistance with respect to the wires Wa and Wb. Therefore, it may be preferable that the charge injector 30 is connected to a portion in the power supply device 40 that is connected to the wire Wa and the wire Wb with a certain degree of electric resistance with respect to the wires Wa and Wb.

Note that the resistance element RI forming the charge injector 30 may be omitted.

Figure 4:
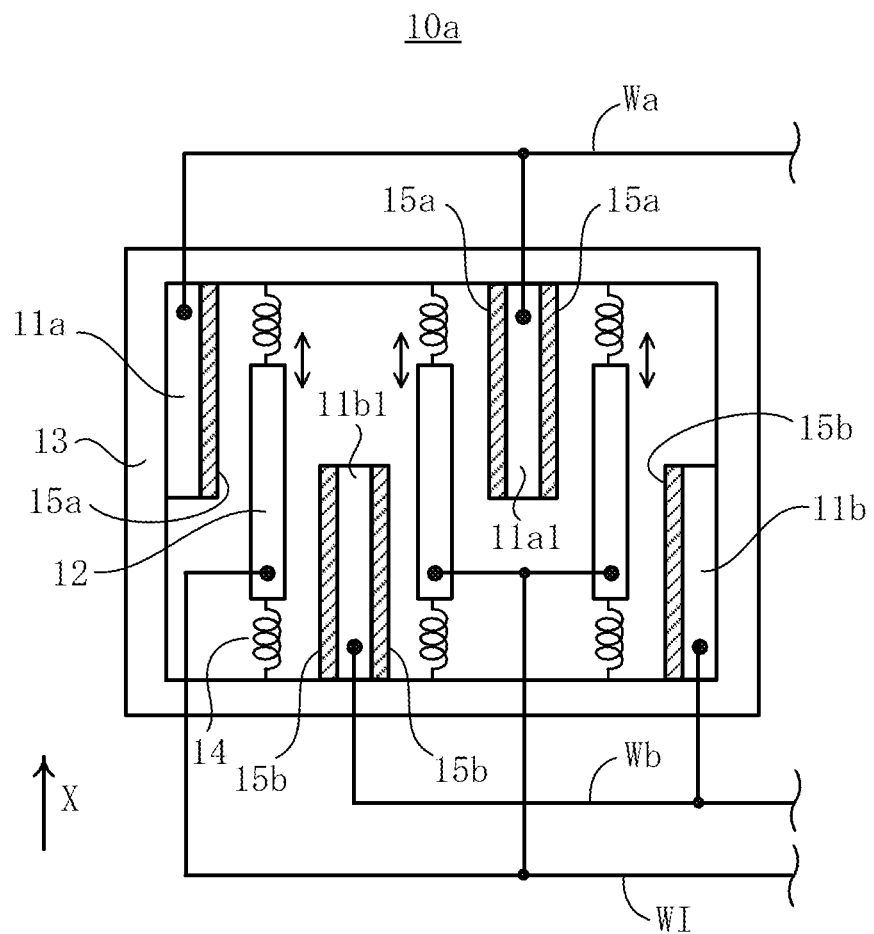
FIG. 4 is a view showing a vibration-driven energy harvesting element 10a of a first modification.

First Modification FIG. 4 is a view showing a vibration-driven energy harvesting element 10a of a first modification.

The same parts as those of the vibration-driven energy harvesting element 10 in the above embodiment are designated by the same reference numerals and the description thereof will be omitted. The vibration-driven energy harvesting element 10a of the first modification has a plurality of electret electrodes 11 arranged in parallel, and an intermediate electrode 12 is arranged between each two of the plurality of electret electrodes 11.

Each intermediate electrode 12 is held via an elastically deformable holding unit 14 such as a spring so that the intermediate electrode 12 can vibrate in the X direction in the figure with respect to the support frame 13. Further, as in the above embodiment, one end of the charge injection wire WI (a part of the charge injector 30 in the above embodiment) for injecting charges into each intermediate electrode 12 is connected to the intermediate electrode 12.

Among the electret electrodes 11, the first electret electrode 11a and the second electret electrode 11b are provided with electrets 15 on sides facing the intermediate electrode 12 as in the above embodiment.

Since each of a third electret electrode 11a1 and a fourth electret electrode 11b1 faces the intermediate electrodes 12 on both sides thereof, electrets 15 are formed on both sides thereof.

A wire Wa is connected to the first electret electrode 11a and the third electret electrode 11a1, while a wire Wb is connected to the second electret electrode 11b and the fourth electret electrode 11b1.

Additionally, the first electret electrode 11a and the third electret electrode 11a1 are arranged offset in the +X direction with respect to the second electret electrode 11b and the fourth electret electrode 11b1.

When the intermediate electrode 12 vibrates with respect to the electret electrode 11 in the X direction, charges are induced in the first electret electrode 11a and the third electret electrode 11a1 and charges are induced in the second electret electrode 11b and the fourth electret electrode 11b1, as in the above embodiment. Thereby, an electric power can be generated.

Also in the first modification, the charge injection wire WI (one end of the charge injector 30) for injecting charges to the intermediate electrode 12 is connected so that the vibration-driven energy harvesting element 10a can prevent the neutralization of the intermediate electrode 12 and maintain a high power generation efficiency for a long period of time.

Second Modification

Figure 5:
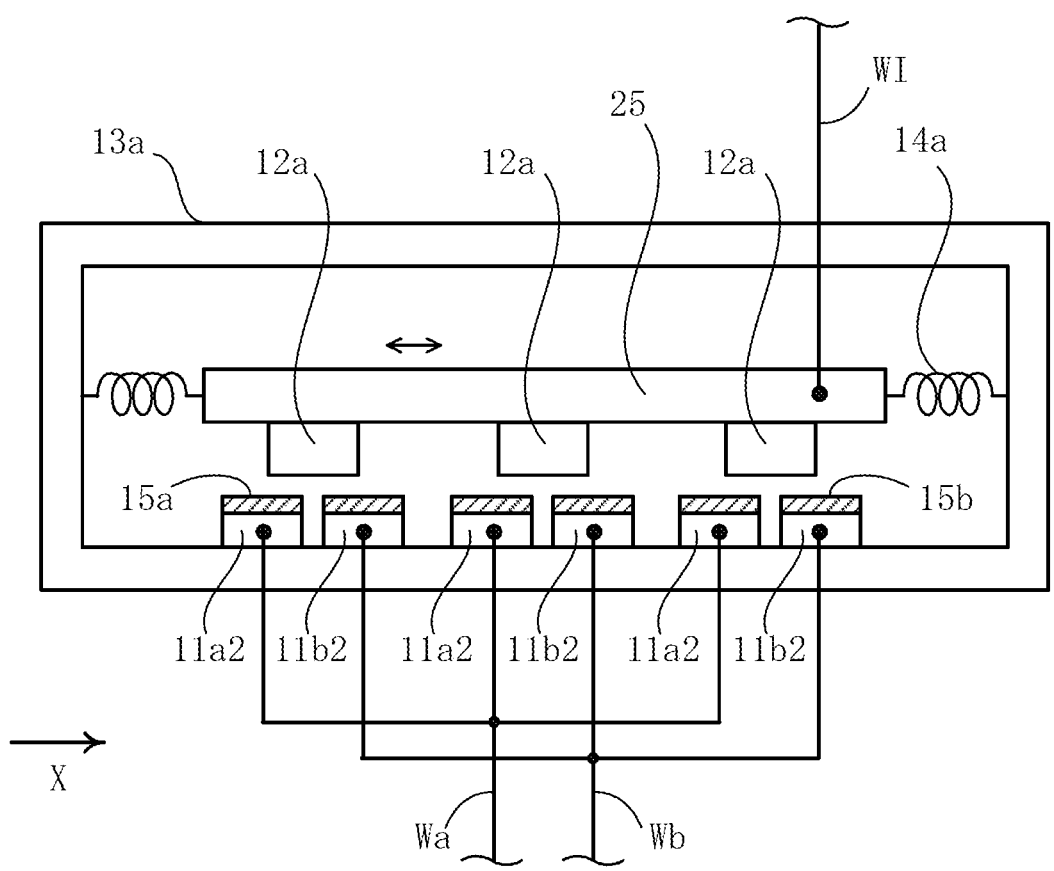
FIG. 5 is a view showing a vibration-driven energy harvesting element 10b of a second modification.

FIG. 5 is a view showing a vibration-driven energy harvesting element 10b of a second modification. The same parts as those of the vibration-driven energy harvesting element 10 in the above embodiment are designated by the same reference numerals and the description thereof will be omitted. In the vibration-driven energy harvesting element 10b of the second modification, a plurality of electret electrodes 11 are fixedly arranged on an inner side surface of the support frame 13a. Further, a plurality of intermediate electrodes 12a are held on a conductive support 25, and the support 25 is held via an elastically deformable insulating holding unit 14a such as a spring so that the support 25 can vibrate in the X direction in the figure with respect to the support frame 13a. A charge injection wire WI is connected to the conductive support 25. Therefore, charges are injected from the charge injection wire WI to the plurality of intermediate electrodes 12a via the conductive support 25.

Each of the plurality of intermediate electrodes 12a is arranged so as to face the first electret electrode 11a2 and the second electret electrode 11b2 with substantially the same facing areas, when the support 25 is located at a center position (neutral position) in the X direction in the vibration. Therefore, the vibration in the X direction of the support 25 holding the intermediate electrode 12a changes an area of a facing portion between each intermediate electrode 12a and the first electret electrode 11a2 and an area of a facing portion between each intermediate electrode 12a and the second electret electrode 11b2. That is, the areas of the facing portions increase and decrease in opposite directions, in other words, in opposite phases.

Thereby, as in the above embodiment, charges are induced in the first electret electrode 11a2 and the second electret electrode 11b2 so that an electric power is generated. A wire Wa is connected to each of the first electret electrodes 11a2 and a wire Wb is connected to each of the second electret electrodes 11b2, so that the induced charges can be extracted via the wires Wa, Wb. Additionally, charges are injected into the intermediate electrode 12a via the charge injection wire WI to prevent neutralization so that the vibration-driven energy harvesting element 10b can maintain a high power generation efficiency for a long period of time.

Third Modification

Figure 6:
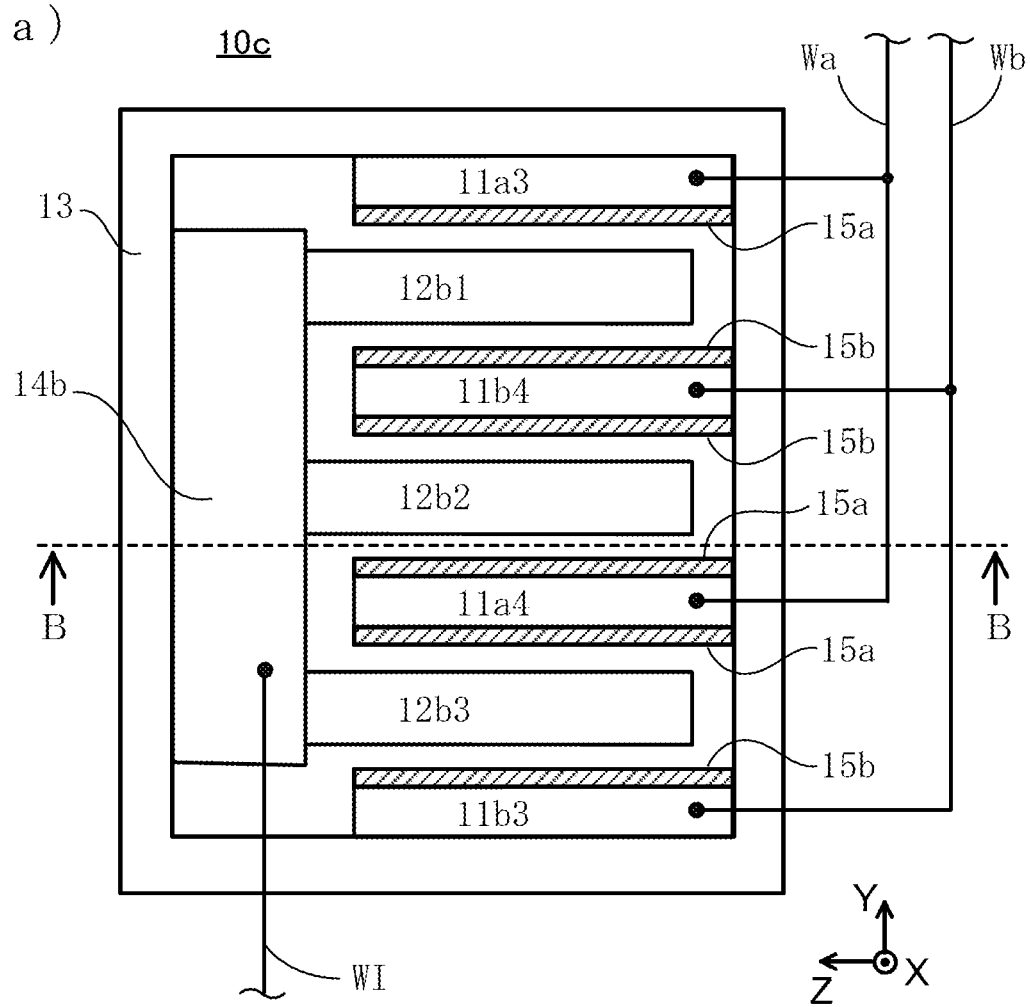
FIG. 6 is a view showing a vibration-driven energy harvesting element 10c of a third modification.
Figure 6:
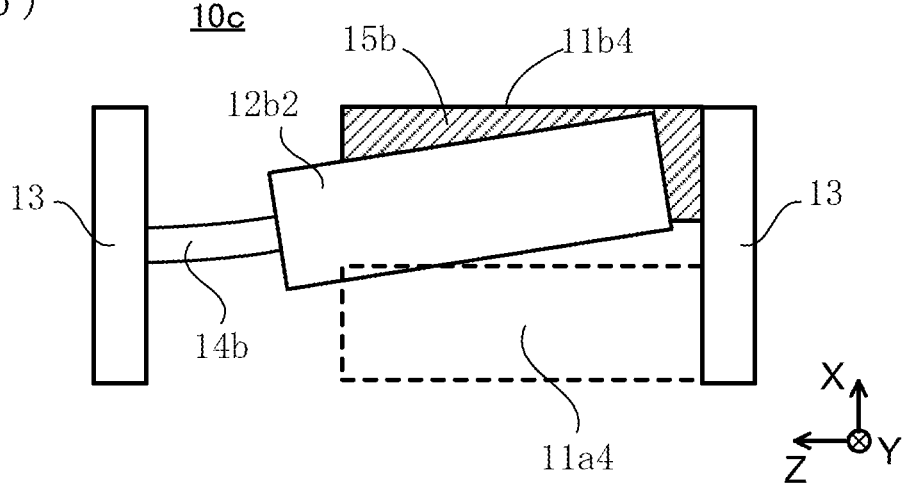

FIG. 6 is a view showing a vibration-driven energy harvesting element 10c of a third modification. FIG. 6(a) shows a top view of the vibration-driven energy harvesting element 10c and FIG. 6(b) shows a cross-sectional view along line B-B in FIG. 6(a) as viewed from the −Y direction. The same parts as those of the vibration-driven energy harvesting element 10 in the above embodiment are designated by the same reference numerals and the description thereof will be omitted.

Similarly to the vibration-driven energy harvesting element 10a of the first modification described above, the vibration-driven energy harvesting element 10c of the third modification has a plurality of electret electrodes 11, and an intermediate electrode 12b1 to 12b3 is arranged between each two of the plurality of electret electrodes 11.

Each of the intermediate electrodes 12b1 to 12b3 is held via an elastically deformable holding unit 14b such as a thin metal plate so that the intermediate electrode can vibrate in the X direction in the figure, with the holding unit 14b as a center. A charge injection wire WI is connected to the holding unit 14b. Therefore, charges are injected from the charge injection wire WI to the intermediate electrodes 12b1 to 12b3 via the conductive holding unit 14b. An insulating member is provided between the holding unit 14b and the support frame 13.

In respect of electret electrodes 11, a first electret electrode 11a3 and a third electret electrode 11a4 connected to a wire Wa are arranged offset in the −X direction with respect to a second electret electrode 11b3 and a fourth electret electrode 11b4 connected to a wire Wb. This state is shown in FIG. 6(b).

FIG. 6(b) is a cross-sectional view along line B-B in FIG. 6(a) as viewed from the −Y direction, in which the intermediate electrode 12b2 swung upward (in +X direction) in the figure and the fourth electret electrode 11b4 behind the intermediate electrode 12b2 (in +Y direction) are shown. Note that the third electret electrode 11a4 indicated by a broken line is shown in FIG. 6(b) for ease of understanding, although the third electret electrode 11a4 is located in the −Y direction with respect to the B-B cross section in FIG. 6(a).

As shown in FIG. 6(b), the swing (vibration) of the intermediate electrode 12b2 in the X direction due to the vibration in the X direction changes an area of a facing portion between the intermediate electrode 12b2 and the third electret electrode 11a4 and an area of a facing portion between the intermediate electrode 12b2 and the fourth electret electrode 11b4. That is, the areas of the facing portions increase and decrease in opposite directions, in other words, in opposite phases.

Thereby, as in the above embodiment, charges are induced in the third electret electrode 11a4 and the fourth electret electrode 11b4 so that an electric power is generated. The same applies to electret electrodes 11 facing other intermediate electrodes 12b1, 12b3.

Thus, an electric power can be generated. Additionally, charges are injected into the intermediate electrodes 12b1 to 12b3 via the charge injection wire WI to prevent neutralization so that the vibration-driven energy harvesting element 10c can maintain a high power generation efficiency for a long period of time.

Figure 7:
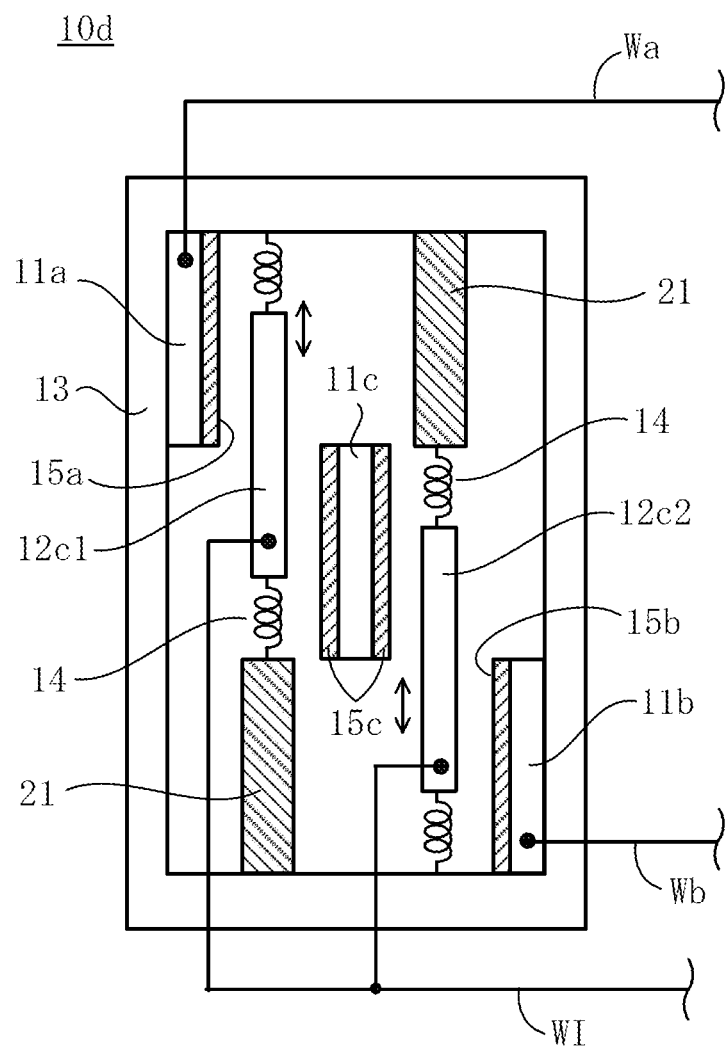
FIG. 7 is a view showing a vibration-driven energy harvesting element 10d of a fourth modification.

Fourth Modification FIG. 7 is a view showing a vibration-driven energy harvesting element 10d of a fourth modification. The same parts as those of the vibration-driven energy harvesting element 10 in the above embodiment are designated by the same reference numerals and the description thereof will be omitted.

In the vibration-driven energy harvesting element 10d of the fourth modification, the first intermediate electrode 12c1, a fifth electret electrode 11c, and the second intermediate electrode 12c2 are arranged in this order from the first electret electrode 11a side, between a first electret electrode 11a fixed to a support frame 13 and connected to a wire Wa and a second electret electrode 11b fixed to the support frame 13 and connected to a wire Wb.

Elastically deformable holding units 14 such as springs are connected to both ends of each of the first intermediate electrode 12c1 and the second intermediate electrode 12c2. One end of each holding unit 14 is connected to the support frame 13, while the other end is connected to a support frame extension 21 fixed to the support frame 13. Therefore, the first intermediate electrode 12c1 and the second intermediate electrode 12c2 are held so that the electrodes can vibrate in the X direction in the figure with respect to the support frame 13.

Further, a charge injection wire WI is connected to each of the first intermediate electrode 12c1 and the second intermediate electrode 12c2.

The fifth electret electrode 11c is fixed to the support frame 13 by a holding mechanism (not shown). The wire Wa, the wire Wb, and other output lines are not connected to the fifth electret electrode 11c, so that the fifth electret electrode 11c is electrically floating. Since both sides of the fifth electret electrode 11c face the first intermediate electrode 12c1 and the second intermediate electrode 12c2, respectively, electrets 15c are formed on both sides thereof.

Also in the vibration-driven energy harvesting element 10d of the fourth modification, the first intermediate electrode 12c1 and the second intermediate electrode 12c2 and the electret electrodes 11 vibrate with respect to each other in the X direction to generate an electric power according to the above-described principle. Additionally, charges are injected into the first intermediate electrode 12c1 and the second intermediate electrode 12c2 via the charge injection wire WI to prevent neutralization so that the vibration-driven energy harvesting element 10d can maintain a high power generation efficiency for a long period of time.

Fifth Modification

Figure 8:
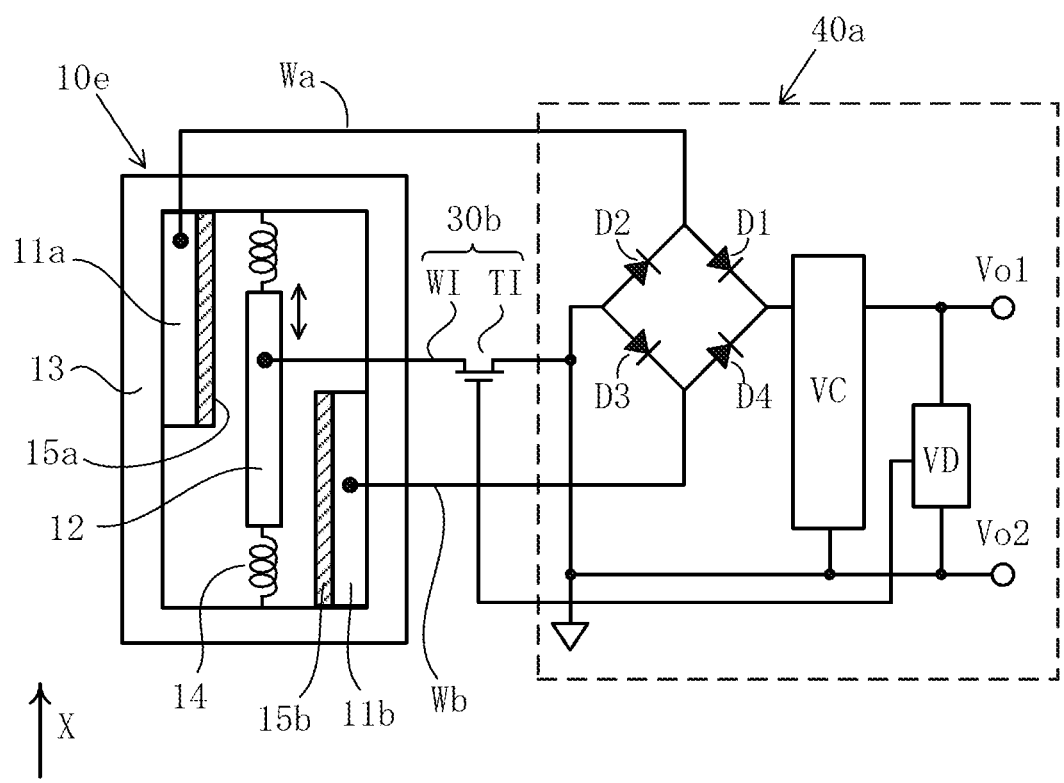
FIG. 8 is a view showing a configuration of a vibration-driven energy harvesting element 10e of a fifth modification and a vibration-driven energy harvesting device 100b including the vibration-driven energy harvesting element 10e.

FIG. 8 is a view showing a vibration-driven energy harvesting element 10e of a fifth modification and a vibration-driven energy harvesting device 100b including the vibration-driven energy harvesting element 10e.

Since the vibration-driven energy harvesting element 10e and the vibration-driven energy harvesting device 100b of the fifth modification have almost the same configuration as that of the vibration-driven energy harvesting element 10 and the vibration-driven energy harvesting device 100 of the above embodiment, the same parts are designated by the same reference numerals and the description thereof will be omitted.

The vibration-driven energy harvesting element 10e of the fifth modification includes a charge injection wire WI and a switching element TI, such as a MOSFET, as a charge injector 30b. The power supply device 40a is provided with a voltage conversion circuit VC, and an output voltage of the voltage conversion circuit VC is monitored by a voltage detection integrated circuit VD. The voltage detection integrated circuit VD sends a control signal to the switching element TI when the output voltage of the voltage conversion circuit VC falls below a predetermined value. This signal causes the switching element TI to be conductive. As a result, charges are injected from the power supply device 40a into the intermediate electrode 12.

When the output voltage of the voltage conversion circuit VC exceeds the predetermined value, the voltage detection integrated circuit VD does not send the control signal to the switching element TI. Thus, the switching element TI is brought into a cutoff state.

In the vibration-driven energy harvesting element 10e of the fifth modification, injection of charges into the intermediate electrode 12 can be controlled by controlling the switching between conduction and cutoff of the switching element TI.

In the fifth modification, a signal obtained by monitoring a voltage in the power supply device 40a is used as a control signal for the switching element TI, which is a control member. Therefore, when the voltage in the power supply device 40a decreases, that is, when the power generation efficiency of the vibration-driven energy harvesting element 10e decreases, charges can be injected into the intermediate electrode 12 to recover the power generation efficiency of the vibration-driven energy harvesting element 10e.

Note that the control signal for the switching element TI is not limited to the signal obtained by monitoring the voltage in the power supply device 40a; for example, trigger signals generated by a timer circuit at predetermined intervals can be used as control signals for the switching element TI.

Sixth Modification

Figure 9:
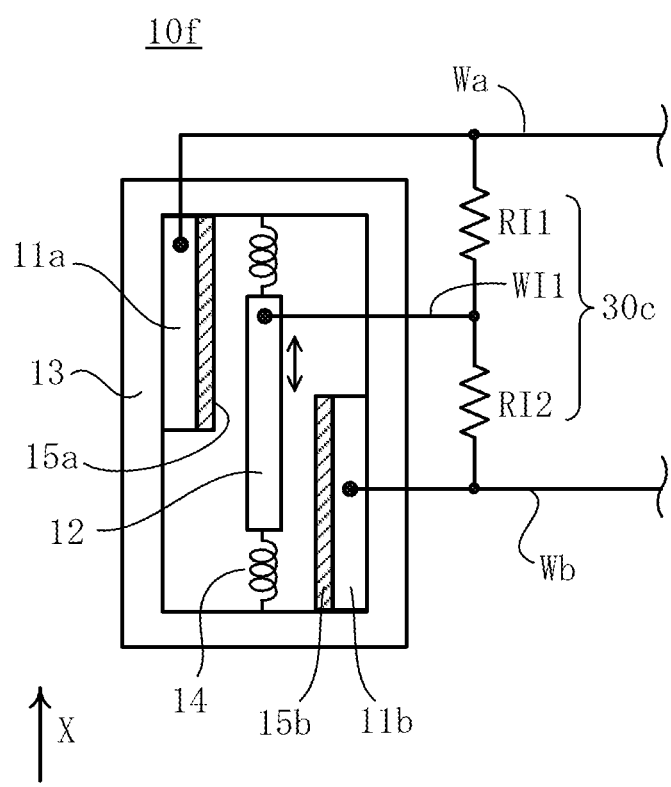
FIG. 9 is a view showing a vibration-driven energy harvesting element 10f of a sixth modification.

FIG. 9 is a view showing a vibration-driven energy harvesting element 10f of a sixth modification.

Since the vibration-driven energy harvesting element 10f of the sixth modification has the almost same configuration as that of the vibration-driven energy harvesting element 10 of the above embodiment, the same parts are designated by the same reference numerals and the description thereof will be omitted.

The vibration-driven energy harvesting element 10f of the sixth modification has a charge injection wire WI having one end connected to an intermediate electrode 12; a resistance element RI1 having one end thereof connected to the other end of the charge injection wire WI and the other end thereof connected to the wire Wa; and a resistance element RI2 having one end thereof connected to the other end of the charge injection wire WI and the other end thereof connected to the wire Wb. The charge injection wire WI, the resistance element RI1, and the resistance element RI2 form a charge injector 30c.

Note that electric resistances of the resistance element RI1 and the resistance element RI2 have sufficiently large resistance values when compared with a resistance due to a load of the power supply device 40 connected to the vibration-driven energy harvesting element 10f.

In the vibration-driven energy harvesting element 10f of the sixth modification, charges are injected into the intermediate electrode 12 from the first electret electrode 11a via the resistance element RI1 and from the second electret electrode 11b via the resistance element RI2. Therefore, charge loss in the intermediate electrode 12 due to discharge can be prevented, and a high power generation efficiency of the vibration-driven energy harvesting element 10f can be maintained for a long period of time.

Note that the method of connecting the resistance element RI1 and the resistance element RI2 is not limited to the above-described manner. For example, the resistance element RI1 and the resistance element RI2 may be directly connected to the first electret electrode 11a and the second electret electrode 11b, respectively, not via the wire Wa and the wire Wb.

Alternatively, one of the resistance elements RI1, RI2 may be omitted, and charges may be injected into the intermediate electrode 12 from either one of the first electret electrode 11a or the second electret electrode 11b.

Further, the resistance elements RI1, RI2 of the vibration-driven energy harvesting element 10f may be replaced by the switching element TI of the fifth modification described above, or the resistance elements RI1, RI2 and the switching element TI may be arranged in series. Thereby, charges may be injected from the electret electrode 11 to the intermediate electrode 12 only when the voltage for generation is reduced.

Further, the charge injectors 30, 30a, 30b included in the fifth and sixth modifications may be applied to the vibration-driven energy harvesting elements 10, 10a to 10d of the first to fourth modifications to inject charges into the intermediate electrodes 12, 12a, 12b.

In the embodiment and modifications described above, the electret electrode 11 is fixed to the support frame 13, and the intermediate electrode 12 vibrates or swings with respect to the support frame 13. However, the configuration is not limited thereto. The intermediate electrode 12 may be fixed to the support frame 13 and the electret electrode 11 may vibrate or swing with respect to the support frame 13.

Additionally, in the embodiment and modifications, the direction of the relative vibration between the intermediate electrode 12 and the electret electrode 11 is the direction (X direction) parallel to the side of the electret electrode 11 facing the intermediate electrode 12. However, the vibration direction is not limited to this direction. For example, with vibration in a direction perpendicular to the facing side, a facing distance between the electret electrode 11 and the intermediate electrode 12 may be changed to change a capacitance of a capacitor formed by both electrodes, thereby inducing charges to generate an electric power.

However, by setting the direction of the relative vibration to be parallel to the side of the electret electrode 11 facing the intermediate electrode 12, the power generation efficiency can be further improved.

Advantageous Effects of Embodiment and Modifications (1) The vibration-driven energy harvesting elements 10, 10a to 10f of the embodiment and modifications described above include a vibration-driven energy harvesting element that outputs an alternating current power from an output line, due to vibration from outside, comprising: an intermediate electrode 12 that is not connected to the output line; a plurality of electret electrodes 11, each electret electrode being arranged to face the intermediate electrode 12 and having an electret 15 on at least a part of a surfaces of a side of the electret electrode facing the intermediate electrode 12; a holding unit 14 that holds the intermediate electrode 12 and the plurality of electret electrodes 11 such that the intermediate electrode 12 and the plurality of electret electrodes 11 can vibrate with respect to each other; and a charge injector 30 that injects a charge having characteristics opposite to a charge of the electrets 15 formed in the surfaces of the plurality of electret electrodes 11, to the intermediate electrode 12. In the embodiment, the vibration of the intermediate electrode 12 causes the intermediate electrode 12 and the plurality of electret electrodes 11 to vibrate with respect to each other.

With this configuration, neutralization of the intermediate electrode 12 can be prevented, and energy of vibration in an environment in which the vibration-driven energy harvesting elements 10, 10a to 10f are placed can be efficiently converted into electric energy for a long period of time. In other words, power generation efficiency can be improved.

(2) Furthermore, by setting the direction of the relative vibration between the electret electrode 11 and the intermediate electrode 12 parallel to the sides of the plurality of electret electrodes 11 facing the intermediate electrode 12, the power generation efficiency can be further improved. Thus, a larger electric power can be generated even if the vibration-driven energy harvesting element has the same size as that of a conventional element.

(3) In (2), when the intermediate electrode 12 moves in a first direction with respect to the plurality of electret electrodes 11, an area of a facing portion between one of the plurality of electret electrodes 11 and the intermediate electrode 12 increases and an area of a facing portion between another of the plurality of electret electrodes 11 and the intermediate electrode 12 decreases; and when the intermediate electrode 12 moves in a second direction different from the first direction, the areas of the facing portions increase and decrease in a manner opposite to the case of the movement in the first direction. Thus, a power generation efficiency can further be improved.

(4) In (1) to (3), the charge injector 30 may connect a part of a circuit (the power supply device 40) powered from the vibration-driven energy harvesting element 10, 10a to 10f, to the intermediate electrode 12.

(5) In (1) to (3), the charge injector 30 may include a resistance element RI1, RI2, and one end of the charge injector 30 is connected to the intermediate electrode 12, and another end of the charge injector 30 is connected to at least one of the plurality of electret electrodes 11.

(6) The vibration-driven energy harvesting element described above may comprise a control member (the switching element TI) that controls injection of a charge into the intermediate electrode 12 by the charge injector 30. With this configuration, charges can be injected into the intermediate electrode 12 by the charge injector 30 only when needed.

(7) The vibration-driven energy harvesting device 100, 100a, 100b described above includes the vibration-driven energy harvesting element 10, 10a to 10f of the above embodiment and modifications, and the power supply device 40, 40a. With this configuration, energy of vibration in the environment in which the vibration-driven energy harvesting devices 100, 100a, 100b are placed can be efficiently converted into electric energy for a long period of time. In other words, a power generation efficiency can be improved.

Although various embodiments and modifications have been described above, the present invention is not limited to thereto. Further, each of the embodiment and modifications may be applied alone or in combination. Other aspects that are conceivable within the technical idea of the present invention are also encompassed within the scope of the present invention.

The disclosure of the following priority application is herein incorporated by reference:
Japanese Patent Application No. 2018-90196 (filed May 8, 2018)

REFERENCE SIGNS LIST 100, 100a, 100b . . . vibration-driven energy harvesting device, 10, 10a to 10f . . . vibration-driven energy harvesting element, 11 . . . electret electrode, 11a . . . first electret electrode, 11b . . . second electret electrode, 12, 12a . . . intermediate electrode, 13, 13a . . . support frame, 14, 14a . . . holding unit, 15, 15a, 15b . . . electret, 30, 30a to 30c . . . charge injector, 40 . . . power supply circuit, D1 to D4 . . . diode, VC . . . voltage conversion circuit, VD . . . voltage detection integrated circuit

The invention claimed is:

1. A vibration-driven energy harvesting element that outputs an alternating current power from output lines of the vibration-driven energy harvesting element, due to vibration from outside, comprising:
an intermediate electrode that is not connected to the output lines of the vibration-driven energy harvesting element;
a plurality of electret electrodes, each electret electrode being arranged to face the intermediate electrode and having an electret on at least a part of a surface of the electret electrode on a side facing the intermediate electrode;
a holding unit that holds the intermediate electrode and the plurality of electret electrodes such that the intermediate electrode and the plurality of electret electrodes can vibrate with respect to each other;
a circuit powered from the vibration-driven energy harvesting element; and
a charge injector that injects a charge having characteristics opposite to a charge of the electrets formed in the surfaces of the plurality of electret electrodes, to the intermediate electrode and connects the intermediate electrode to the circuit powered from the vibration-driven energy harvesting element,
wherein each of the plurality of electret electrodes has an output connected to a respective input of the circuit powered from the vibration-driven energy harvesting.

2. The vibration-driven energy harvesting element according to claim 1, wherein:
a direction of the relative vibration is parallel to the surfaces of the plurality of electret electrodes facing the intermediate electrode.

3. The vibration-driven energy harvesting element according to claim 2, wherein:
when the intermediate electrode moves in a first direction with respect to the plurality of electret electrodes due to the relative vibration, an area of a facing portion between one of the plurality of electret electrodes and the intermediate electrode increases and an area of a facing portion between another of the plurality of electret electrodes and the intermediate electrode decreases; and when the intermediate electrode moves in a second direction different from the first direction, the areas of the facing portions increase and decrease in a manner opposite to the case of the movement in the first direction.

4. The vibration-driven energy harvesting element according to claim 3, comprising: a control member that controls injection of a charge into the intermediate electrode by the charge injector.

5. The vibration-driven energy harvesting element according to claim 3, wherein:
the charge injector includes a resistance element, and one end of the charge injector is connected to the intermediate electrode and another end of the charge injector is connected to at least one of the plurality of electret electrodes.

6. The vibration-driven energy harvesting element according to claim 2, comprising: a control member that controls injection of a charge into the intermediate electrode by the charge injector.

7. The vibration-driven energy harvesting element according to claim 2, wherein:
the charge injector includes a resistance element, and one end of the charge injector is connected to the intermediate electrode and another end of the charge injector is connected to at least one of the plurality of electret electrodes.

8. The vibration-driven energy harvesting element according to claim 1, wherein:
the charge injector includes a resistance element, and one end of the charge injector is connected to the intermediate electrode and another end of the charge injector is connected to at least one of the plurality of electret electrodes.

9. The vibration-driven energy harvesting element according to claim 1, comprising: a control member that controls injection of a charge into the intermediate electrode by the charge injector.

10. A vibration-driven energy harvesting device, comprising:

a vibration-driven energy harvesting element according to claim 1; and a power supply device which includes the circuit powered from the vibration-driven energy harvesting element.

* * * * *